United States Patent
Robinson et al.

(10) Patent No.: US 10,116,322 B1
(45) Date of Patent: Oct. 30, 2018

(54) RAIL ADAPTIVE DITHER

(71) Applicant: Raytheon Company, Waltham, MA (US)

(72) Inventors: Ian S. Robinson, Waltham, MA (US); James Toplicar, Waltham, MA (US); Daniel Thompson, Waltham, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/828,566

(22) Filed: Dec. 1, 2017

(51) Int. Cl.
| *H03M 1/12* | (2006.01) |
| *H03M 3/00* | (2006.01) |
| *G01S 7/35* | (2006.01) |
| *G01S 7/292* | (2006.01) |

(52) U.S. Cl.
CPC ......... *H03M 3/334* (2013.01); *H03M 3/458* (2013.01); *G01S 7/292* (2013.01); *G01S 7/354* (2013.01); *H03M 3/332* (2013.01)

(58) Field of Classification Search
CPC ....... H03M 3/458; H03M 3/332; G01S 7/292; G01S 7/354
USPC .................................................. 341/155, 131
See application file for complete search history.

(56) References Cited

U.S. PATENT DOCUMENTS

| 5,187,481 | A | * | 2/1993 | Hiller | ................. | H03H 21/0012 341/131 |
| 5,745,061 | A | | 4/1998 | Norsworthy et al. | | |
| 5,990,815 | A | * | 11/1999 | Linder | ................. | H03M 1/0641 341/131 |
| 6,268,814 | B1 | | 7/2001 | Kolsrud | | |
| 7,362,250 | B2 | | 4/2008 | Zhang et al. | | |
| 7,663,518 | B2 | * | 2/2010 | Hurrell | ................. | H03M 1/0641 341/131 |
| 7,696,910 | B2 | * | 4/2010 | Koyama | ................ | H03M 3/328 341/131 |

OTHER PUBLICATIONS

Wannamaker, "The Theory of Dithered Quantization," A thesis presented to the University of Waterloo in fulfillment of the thesis requirement for the degree of Doctor of Philosophy in Applied Mathematics, Waterloo, Ontario, Canada, 2003.
Plisch, "Maximizing SFDR Performance in the GSPS ADC: Spur Sources and Methods of Mitigation," Application Report, SLAA617, Texas Instruments, Dec. 2013.
Melkonian, "AN-804 Improving A/D Converter Performance Using Dither," Literature No. SNOA232, National Semiconductor Application Note 804, Texas Instruments, Feb. 1992.
"Dithering in Analog-to-digital Conversion," 0869-BDC-06/07, e2v semiconductors SAS, www.e2v.com, 2007.

* cited by examiner

*Primary Examiner* — Brian Young
(74) *Attorney, Agent, or Firm* — Burns & Levinson, LLP; Joseph M. Maraia

(57) ABSTRACT

A system and method of converting an analog input signal to a linearized digital representation of the analog input signal. A measure of the analog input signal is compared to a threshold associated with a maximum dynamic range of a quantizer. A maximum amplitude of a random, analog dither signal is dynamically varied for perturbing quantization of the analog input signal in response to the comparison. The dynamically varied dither signal and the analog input signal are combined to obtain a dithered input signal. The quantizer converts the dithered input signal into the linearized digital representation of the analog input signal.

12 Claims, 3 Drawing Sheets

RAIL ADAPTIVE DITHER

TECHNICAL FIELD

The present disclosure relates generally to analog-to-digital conversion, and more specifically, to linearization through dithering.

BACKGROUND

High performance analog-to-digital converters (ADCs) are now widely used in many applications, including RF receivers (e.g., radar) and electronic countermeasures, communication systems, test instrumentation and others, that handle large dynamic ranges of signal amplitudes of a high data rate signals.

Dynamic specifications for ADCs are typically expressed in the frequency domain, using Fast Fourier Transforms (FFTs) to derive the specifications. With reference to FIG. 1, an example fundamental input signal 100 is shown at its carrier frequency 102, and its power amplitude 104 is shown as less than the full scale range 106 of the associated ADC, providing headroom 108, which is important to avoid clipping of the input signal in the case of offsets from the ADC or input signal generator. Spurious-free dynamic range (SFDR) 110 of the ADC is often defined as the distance in dB from the fundamental input signal 100 peak amplitude 104 to the peak spur level 112 in the output frequency spectrum, which could represent noise and is not necessarily limited to harmonic components of the analog input signal 100. An average noise floor 114 may be derived from both the average noise of the ADC and the FFT operation itself. The noise performance of the ADC is expressed as signal-to-noise ratio, or SNR=6.02n+1.76+10 log(m/2), where n=ADC resolution, and in =FFT points, and the signal is the RMS (root mean square) power of the fundamental input signal 100, and the noise is the RMS sum of all non-fundamental harmonics in the Nyquist band, excluding DC. For a given sampling frequency, $f_S$, the theoretical RMS quantization noise in the bandwidth of input frequencies from DC to $f_S/2$ is given as $q/\sqrt{n}$, where q is the weight of the ADC's least significant bit (LSB) and n is the number of bits.

Two fundamental limitations to maximizing SFDR in a high-speed ADC are the distortion produced by its front end electronics (i.e., amplifier and sample-and-hold circuit) and that produced by nonlinearity in the transfer function of the encoder portion of the ADC. While little can be done externally to the ADC to significantly reduce the inherent distortion caused by its front end, differential nonlinearity (DNL) in the ADC's encoder transfer function can be reduced by the proper use of external techniques. With reference to FIGS. 2A and 2B, DNL error is generally defined as the difference between an actual transfer function step width 200 (e.g., resulting from comparison of the input signal 202 to a precise reference voltage 202a provided by a reference voltage ladder 204 at a comparator circuit 206a as shown in FIG. 2B) and the ideal value of 1 LSB 208 as shown in FIG. 2A, and is often due to mismatches in the ADC's resistance ladder 204 providing threshold reference voltages 204a-204n and its comparator circuits 206a-206n (in a typical 12-bit ADC, a linear voltage step, 1 LSB, is approximately 250 mV).

Even a small non-linearity in an ADC's transfer function can cause harmonics. Particularly, when input signal amplitude and quantization step feature the same order of magnitude, the distortion can be serious in ways that decrease SFDR by consuming headroom. Therefore, when input signal features small amplitude, DNL error must be reduced to increase the ADC's SFDR. A receiver with excellent SFDR is able to receive at maximum data rate even when receive signals are at the low amplitude range of the receiver. DNL errors effectively decrease a receiver's SFDR rating.

A well-known technique called dithering is often utilized to maximize SFDR. Dithering is the process of adding an uncorrelated signal, such as pseudo random noise (PRN) or broadband noise, to a desired analog signal prior to the analog input gate of the ADC. Although the injected dither does not eliminate the errors, it randomizes the DNL errors of the ADC, thereby eliminating the concentration of DNL errors at a small number of codes. This technique improves the resolution and linearity of the conversion by effectively smoothing the quantization errors of the ADC's transfer function.

The effect of quantization noise is even more pronounced in broadband data converters. Wider ADC operating bands result in more thermal noise being integrated and impacting dynamic range. As the demand for both linearity and bandwidth increases, a physical limit is being reached and only a tradeoff between the bandwidth and the dynamic range can be considered. On the other hand, higher speeds could be achieved with a lower number of bits, if dynamic performance issues can be addressed. Thus, as technologies evolve toward element-level digitization, the need increases for low cost dithering techniques that efficiently provide high linearity analog to digital conversion in a manner that does not consume headroom. That is dither uses up some of the ADC's dynamic range. Unless a mitigation process is employed the dither impacts and reduces the maximum size input analog signal.

In some systems dither is varied to improve stability of the quantizer, especially in delta-sigma (DS) data converters. Stability, which manifests as a rise in quantization noise or a latchup condition at saturation, can suffer in these converters that use feedback loops. Reducing the dither amplitude as a function of the size of the signal entering the quantizer (not the analog input signal in the case of DS converters) can improve stability but does not optimize the allowable size of the analog input signal.

In other systems the output of the ADC is measured and used to control the dither power but latency in this measurement precludes avoiding saturation of the ADC by subsequent inputs or requires much smaller dither power that may be needed to maximize linearity. The desired scenario is to input as much dither as needed to maximize linearity without impacting the maximum size analog input signal that can be accommodated by the ADC's headroom or dynamic range.

SUMMARY

The present disclosure describes embodiments of improved architectures and techniques for linearizing quantization of an input RF signal through the application of a low-cost dither noise signal responsive to measurement of the RF signal against a threshold approaching the maximum input (rail) voltage of a quantizer.

In one embodiment, an analog to digital data conversion system is provided, including an input circuit including a comparator for receiving an analog input signal and comparing a measure of the analog input signal against at least one threshold associated with a maximum dynamic range of a quantizer, a dither circuit including a noise generator and variable gain control coupled to the input circuit and operational to dynamically vary a maximum amplitude of a random analog dither signal produced by the noise generator in response to the threshold comparison(s) in order to avoid quantizer saturation while ensuring toggling of at least one quantizer LSB. The data conversion system includes a combiner circuit coupled to the input circuit and the dither circuit and operational to combine the dynamically varied dither signal and the analog signal to be converted to produce a dithered analog signal that is provided to the quantizer which is operational to convert the dithered analog signal to a linearized digital representation of the received analog signal. In another aspect, the disclosure includes the method of using this architecture to linearize the quantizer response.

The quantizer may comprise a resistor reference ladder coupled to a bank of comparators, each resistor in the reference ladder providing a reference voltage proportional to the rail voltage of the quantizer to a corresponding comparator in the bank of comparators. In one embodiment, the polarity of the reference voltages on the resistor reference ladder may be switched during the quantization process.

In various embodiments, quantization of the input signal by the quantizer is perturbed by adding the amplitude-adjusted instance of the analog dither signal in response to the threshold comparison. The maximum amplitude of the dither signal may be dynamically lowered to less than a few LSBs of the quantizer if the measure of the analog input signal exceeds the threshold or raised above the MSB of the quantizer. In another embodiment, multiple distinct thresholds may be applied by the comparator to the input signal, and corresponding dynamic dither signal amplitude adjustments effected by the dither circuit.

In another embodiment, the maximum amplitude of the dither signal is dynamically varied to be approximately equal to or less than one LSB of the quantizer. In another embodiment the dither signal preferably comprises a uniform distribution noise signal.

In another embodiment, the system includes a time delay element that operates to receive the analog input signal prior to combination with the dynamically varied dither signal to compensate for time required to dynamically vary the amplitude of the dither signal.

In another aspect, the dither signal may occupy one or more frequencies outside a frequency band of the input signal.

The foregoing and other features and advantages of the embodiments will be apparent from the following more particular description, as illustrated in the accompanying figures of the drawing.

BRIEF DESCRIPTION OF THE FIGURES

The present disclosure is further described in reference to the noted plurality of figures by way of non-limiting examples of embodiments, in which like reference numerals represent similar parts throughout the several views of the figures, wherein.

DETAILED DESCRIPTION

The details described and illustrated herein are by way of example and for purposes of illustrative description of the exemplary embodiments only, and are presented in the case of providing what is believed to be the most useful and readily understood description of the principles and conceptual aspects of the disclosure. In this regard, no attempt is made to show structural details of the subject matter in more detail than is necessary for the fundamental understanding of the disclosure, the description taken with the drawings making apparent to those skilled in that how the several forms of the present disclosure may be embodied in practice with additional components or steps and/or without all of the components or steps that are described. Further, like reference numbers and designations in the various drawings indicate like elements.

Figure 1:
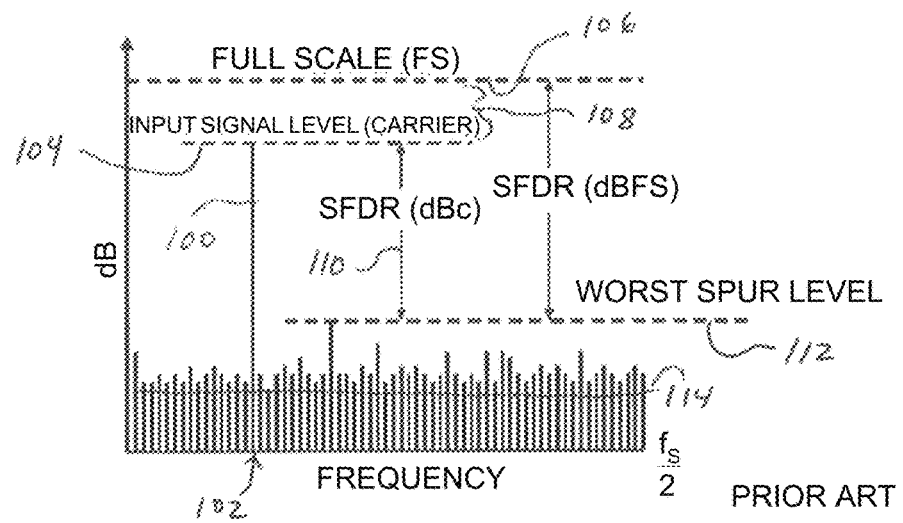
FIG. 1 is a plot of an exemplary FFT output for characterizing an ADC.
Figure 2A:
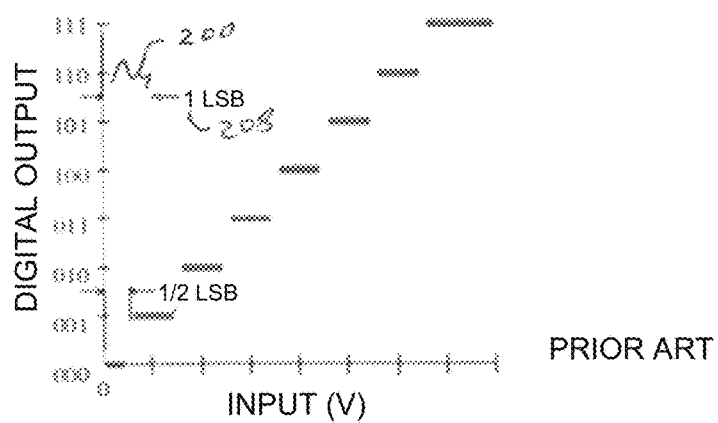
FIGS. 2A and 2B illustrate, respectively, a plot of a typical "stair case" transfer function of an ADC, and a circuit diagram of a conventional quantizer.
Figure 2B:
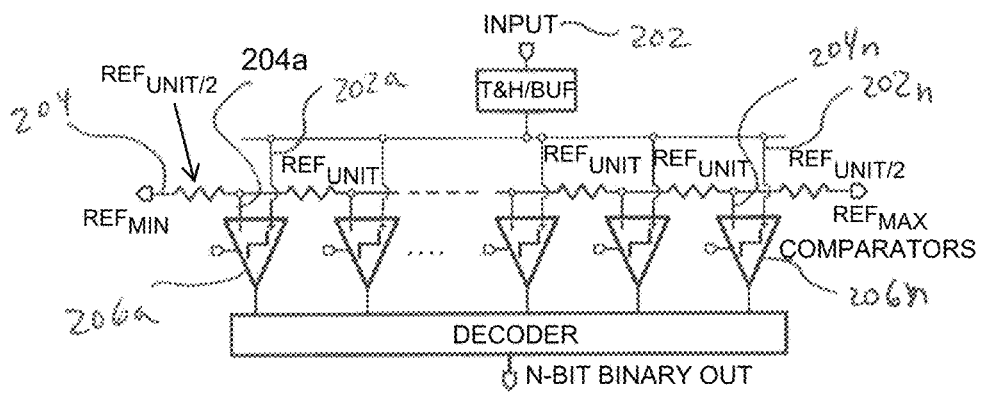
Figure 3:
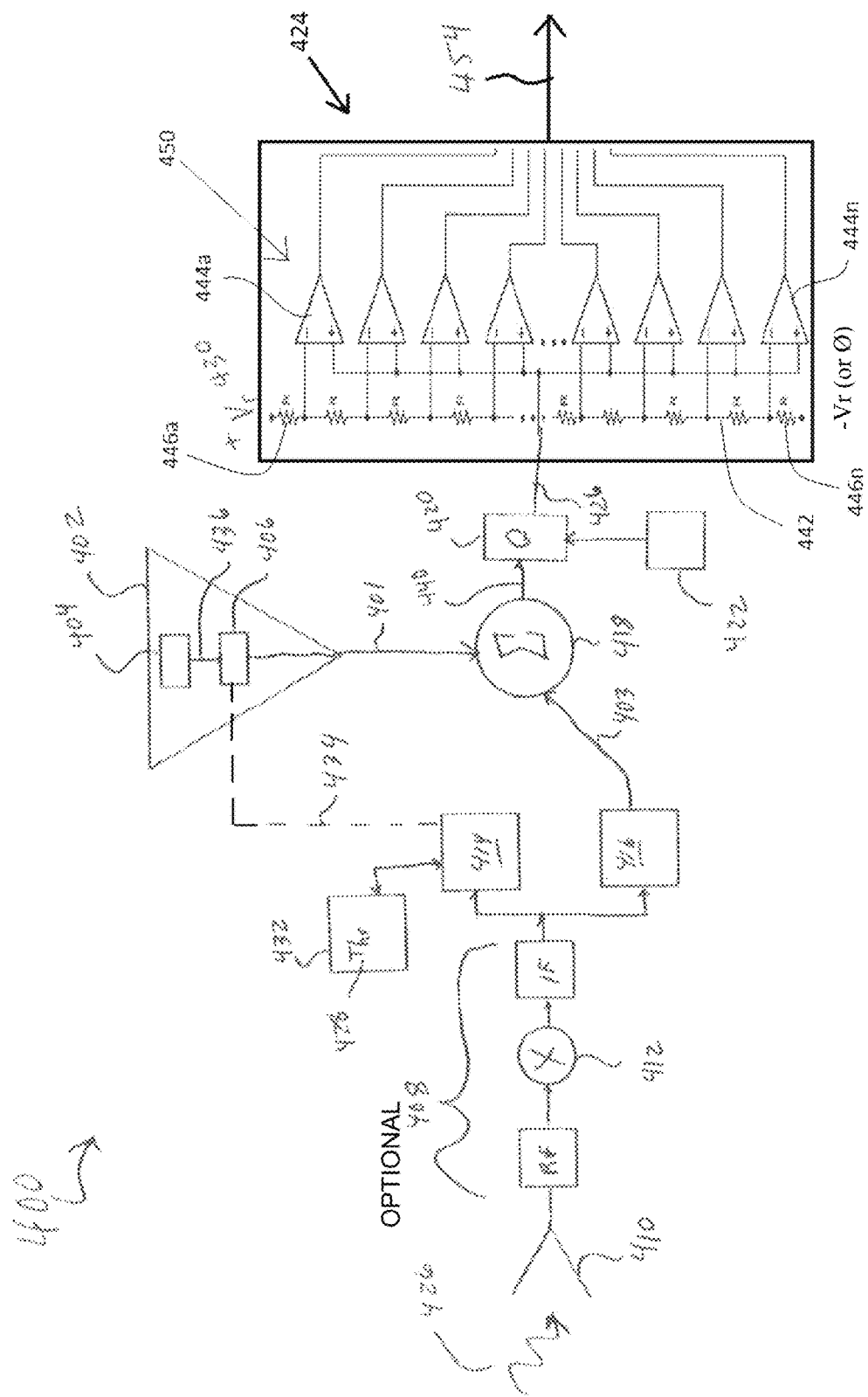
FIG. 3 is a schematic circuit diagram of an exemplary analog to digital conversion system in accordance with an embodiment of the disclosure.

FIG. 3 shows a schematic diagram of a conversion system 400 in accordance with an exemplary embodiment of the present disclosure. System 400 provides a dither signal 401 to an RF analog signal 403 being quantized in order to linearize (i.e., reduce the size and number of spurs of) quantization in a manner less costly than conventional dithered quantization. The addition of dither signal 401 to the input signal 403 prior to digitization, in essence, spreads the effect of the signal's interaction with the quantization measurement system, reducing the measurement system's imperfections. As illustrated, system 400 includes a dither generator circuit 402 including an analog noise source 404 and a dither compensator circuit 406. System 400 also includes optional front end circuitry 408 including an antenna 410 and a frequency conversion circuit including a local oscillator 412. Further, system 400 includes a comparator 414, a delay circuit 416, a combiner circuit 418, optional gain control circuitry including an amplifier circuit 420 and gain control logic 422, and a quantizer 424. Quantizer 424 must have sufficient headroom so that saturation does not occur during quantization of an analog input signal 426. Conversion system 400 operates such that when input signal 426 is detected to be above or below a threshold 428, the amount of analog dither added to the input signal 403 is compensated, ensuring the ADC does not saturate, improving the dynamic range of quantizer 424.

Each of the sections of conversion system 400 may be coupled together using any of a variety of coupling means such as an electrical circuit, a communication bus, or another type of coupling means. One or more of the sections of the conversion system 400 may be combined (e.g., integrated together). The system 400 may be arranged as an ADC packaged in a single integrated circuit (IC) chip. The single IC chip arrangement may include the quantizer 424 and any or none of the other sections. Any of the sections not included within the IC chip may be coupled to the IC chip. The IC chip may include one or more input pins/terminals and/or one or more output pins/terminals for coupling the IC chip to the sections not included within the IC chip.

Input signal 426 may be received at antenna 410 and down-converted by local oscillator 412 into an RF intermediate frequency IF before being fed to comparator 414 and delay circuit 416. Comparator 414 compares the amplitude of input signal 426 to threshold 428 that is near or at the full scale rail voltage T. 430 of the quantizer 424. The threshold 428 could be retrieved from a memory 432, or in other embodiments provided from quantizer 424 or an external source (not shown). In response to the threshold comparison, comparator 414 generates a control signal 434 that is provided to dither compensator circuit 406.

Figure 4:
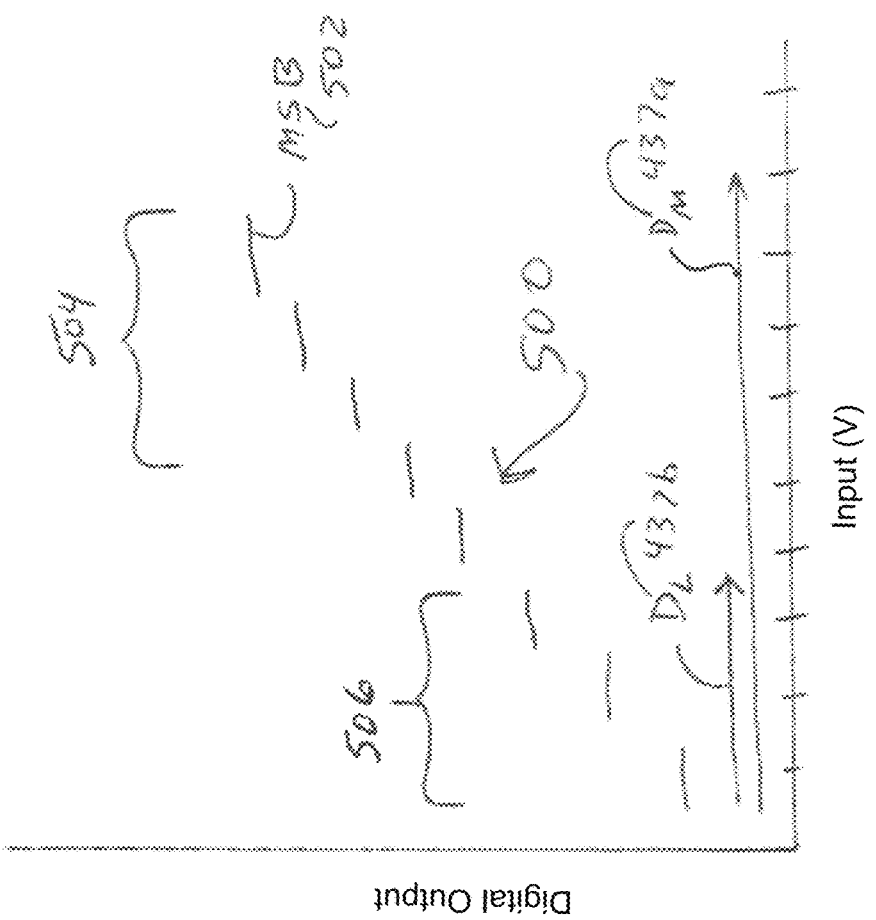
FIG. 4 is a plot of an exemplary FFT output for a quantizer being provided a dithered analog signal in accordance with an embodiment of the disclosure.

Based on the amplitude level of the input signal 426, the control signal 434 causes dither compensator circuit 406 to vary the amplitude of a random, non-deterministic, analog noise signal 436 output from analog noise source 404 and fed to dither compensator circuit 406. In this way, the dither generator 402 produces a dither signal 401 which has been varied based on the input signal 426 such that adding the dither to the input signal will not cause saturation of the quantizer. In one embodiment, the analog noise source 404 may comprise a low-cost thermal noise diode. The quantum mechanical nature of electron-hole paring process within such devices produces a truly random noise signal with very high bandwidth. In a preferred embodiment, the analog noise source 404 comprises a uniform analog noise generator, as noise provided from such a source enables a deterministic maximum voltage and can be created inexpensively (whereas Gaussian noise has tails). The dither signal 401 output from dither generator 402 is preferably uncorrelated in time and with the desired RF analog input signal 426. It is desirable to apply the largest amount of dither signal 401 to the input signal 426 that will not cause quantizer 424 to be driven into saturation. To be maximally effective, the dither signal 436 must span (or "toggle") any imperfections in the quantizer 424 "stair case" transfer function 500, such as shown in FIG. 4. In one embodiment, a "full" or maximum dither signal amplitude 437a toggles all but the MSB 502 or last few LSBs 504 of the staircase transfer function 500 of quantizer 424 for most input signals, but reduces the dither when the input signal 426 amplitude approaches the rail voltage V, 430 to an amplitude 437b that bridges only one or a few LSBs 506 at the highest input signal 426 levels. When the input signal 426 returns to a lower level, the dither signal 401 may again be raised (or switched) to toggle at least a few of the highest LSBs 504. Referring again to FIG. 3, dither compensator circuit 406 may comprise a variable gain amplifier that responsively varies the dither signal amplitude 437 as a function of control signal 434.

Alternative embodiments will be readily apparent to those of skill in the art. For example, the dither compensator circuit 406 may reduce the analog noise signal 436 amplitude 437 by a fixed compensation amount (e.g., one-half, completely shut off, etc.), or the dither signal 401 may even be subtracted from the input signal 403. In yet another embodiment, more than one threshold 428 may be compared to the input signal 426, resulting in distinct control signals 434 and corresponding compensation levels for the dither signal 401.

Adder circuit 418 receives the dither signal 401 and input signal 403, which may comprise the down-converted input signal 426 that has been delayed by delay circuit 416 (e.g., a flip-flop element, etc.) to compensate for the time it takes for the threshold comparison and responsive dither signal 436 amplitude compensation in response to occur. In most cases, the analog dither signal 401 has a power less than or equal to $\frac{1}{10}^{th}$ the power of the input signal 403, and has a maximum amplitude less than the MSB 502 of quantizer 424. For multi-bit quantizers, the dither amplitude 437 is normally well below the MSB 502 of quantizer 424, so the dither is root sum squared with other noise voltages to obtain the system noise level. Adder circuit 418 combines the dither signal 401 and input signal 403 to form a dithered analog signal 440. The dithered analog signal 440 is then provided to comparators 444a-444n within a bank of comparators 450 in the quantizer 424 (optionally after passing through amplifier circuit 420). The quantizer 424 also includes a resistor reference ladder 442 with a plurality of resistors 446a-446n, each providing a reference voltage to a corresponding comparator 444a-444n in the bank of comparators 450. The quantizer 424 then produces a linearized digital representation 454 of the dithered analog signal 440.

Various embodiments of the above-described systems and methods may be implemented in digital electronic circuitry and/or firmware. Method steps can be performed by one or more programmable processors and/or controllers executing a computer program to perform the disclosed techniques by operating on input data and generating output. Method steps can also be performed by, and an apparatus can be implemented as, special purpose logic circuitry.

Whereas many alterations and modifications of the disclosure will no doubt become apparent to a person of ordinary skill in the art after having read the foregoing description, it is to be understood that the particular embodiments shown and described by way of illustration are in no way intended to be considered limiting. Further, the subject matter has been described with reference to particular embodiments, but variations within the spirit and scope of the disclosure will occur to those skilled in the art. It is noted that the foregoing examples have been provided merely for the purpose of explanation and are in no way to be construed as limiting of the present disclosure.

What is claimed is:

1. A method of converting an analog input signal to a linearized digital representation of the analog input signal, comprising:
   comparing a measure of the analog input signal to a threshold associated with a maximum dynamic range of a quantizer;
   dynamically varying a maximum amplitude of a random, analog dither signal for perturbing quantization of the analog input signal in response to the comparison;
   combining the dynamically varied dither signal and the analog input signal to obtain a dithered input signal; and
   converting with the quantizer the dithered input signal into the linearized digital representation of the analog input signal.

2. The method of claim 1, wherein the maximum amplitude is lowered to less than a few least significant bits of the quantizer if the measure of the analog input signal exceeds the threshold.

3. The method of claim 1, wherein the maximum amplitude is raised above a most significant bit of the quantizer.

4. The method of claim 1, further comprising:
   further comparing the measure of the analog input signal to at least one additional threshold; and
   further varying the maximum amplitude of the dither signal to a level based upon the at least one additional threshold comparison.

5. The method of claim 1, further comprising generating the random, analog dither signal with a uniform distribution noise generator.

6. The method of claim 1, wherein the root mean square noise level of the dither signal is approximately equal to or less than one least significant bit of the quantizer.

7. The method of claim 1, further comprising adjusting gain of the quantizer such that the dither signal toggles one or more least significant bits of the quantizer.

8. The method of claim 1, further comprising introducing a time delay to the analog input signal prior to combining with the dynamically varied dither signal to compensate for time required to dynamically vary the amplitude of the dither signal.

9. The method of claim 1, wherein the dither signal occupies one or more frequencies outside a frequency band of the input signal.

10. The method of claim 1, wherein:
the quantizer comprises a resistor reference ladder coupled to a bank of comparators, each resistor in the reference ladder providing a reference voltage to a corresponding comparator in the bank of comparators; and
converting comprises reversing the reference voltages on the resistor reference ladder.

11. The method of claim 1, wherein the analog input signal comprises an RF radar signal.

12. An analog to digital conversion system for converting an analog input signal into a linearized digital representation of the analog input signal, comprising:

a quantizer;
an input circuit including a comparator for receiving the analog input signal and comparing a measure of the analog input signal against at least one threshold associated with a maximum dynamic range of the quantizer;
a dither circuit coupled to the input circuit and including a noise generator, the dither circuit operational to dynamically vary a maximum amplitude of a random analog dither signal in response to the comparison, the analog dither signal for perturbing quantization of the analog input signal to be converted; and
a combiner circuit coupled to the input circuit and the dither circuit and operational to combine the dynamically varied dither signal and the analog input signal to be converted to produce a dithered analog signal;
wherein the quantizer is coupled to the combiner circuit and operational to convert the dithered analog signal to a linearized digital representation of the analog input signal.

* * * * *